(12) United States Patent  
Peng et al.

(10) Patent No.: US 12,288,689 B2  
(45) Date of Patent: Apr. 29, 2025

(54) SEMICONDUCTOR STRUCTURE

(71) Applicant: Winbond Electronics Corp., Taichung (TW)

(72) Inventors: Pei-Hsiu Peng, Taichung (TW); Hung-Yu Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 368 days.

(21) Appl. No.: 17/857,030

(22) Filed: Jul. 3, 2022

(65) Prior Publication Data

US 2024/0006178 A1    Jan. 4, 2024

(51) Int. Cl.  
*H01L 21/033*     (2006.01)  
*H01L 21/66*      (2006.01)

(52) U.S. Cl.  
CPC ...... *H01L 21/0338* (2013.01); *H01L 21/0335* (2013.01); *H01L 21/0337* (2013.01); *H01L 22/12* (2013.01)

(58) Field of Classification Search  
CPC ............. H01L 21/0332; H01L 21/0334; H01L 21/0335; H01L 21/0337; H01L 21/0338  
See application file for complete search history.

(56) References Cited

U.S. PATENT DOCUMENTS 9,805,994 B1 * 10/2017 Lam ................. H01L 22/32  
2023/0046754 A1 * 2/2023 Li ..................... H01L 22/32

* cited by examiner

*Primary Examiner* — Walter H Swanson  
(74) *Attorney, Agent, or Firm* — JCIPRNET

(57) ABSTRACT

Provided is a semiconductor structure including multiple pairs of target patterns, a first conductive line, and a second conductive line. Each of the pairs of target patterns includes a top pattern and a bottom pattern. The first conductive line is disposed on a first side of the pairs of target patterns. The first conductive line is electrically connected to a top pattern of a $(aN+1)^{th}$ pair of target patterns in the pairs of target patterns, a is a fixed integer greater than or equal to 2, and N is an integer greater than or equal to 0. The second conductive line is disposed on a second side of the pairs of target patterns opposite to the first side. The second conductive line is electrically connected to a bottom pattern of the $(aN+1)^{th}$ pair of target patterns in the pairs of target patterns.

12 Claims, 12 Drawing Sheets

SEMICONDUCTOR STRUCTURE

BACKGROUND

Technical Field

The disclosure relates to a semiconductor structure.

Description of Related Art

The critical dimensions of semiconductor components is getting smaller and smaller, making photolithography process more and more difficult. In conventional photolithography processes, methods of reducing critical dimensions include the use of larger numerical aperture (NA) optics, shorter exposure wavelengths (e.g. EUV) or interface media other than air (e.g. water immersion). As the resolution of photolithography processes is known to approach theoretical limits, there has been a shift to dual patterning methods to overcome the optical limits and further increase the integration of semiconductor components.

However, most of the current inspection methods for semiconductor structures after double patterning are based on manual visual inspection by random testing. This method is labor-intensive and cannot be automated and inspected in large quantities. Therefore, the current inspection method still faces some challenges.

SUMMARY

The disclosure provides a semiconductor structure including multiple pairs of target patterns, a first conductive line, and a second conductive line. Each of the pairs of target patterns includes a top pattern and a bottom pattern. The first conductive line is disposed on a first side of the pairs of target patterns. The first conductive line is electrically connected to a top pattern of a $(aN+1)^{th}$ pair of target patterns in the pairs of target patterns. a is a fixed integer greater than or equal to 2 and N is an integer greater than or equal to 0. The second conductive line is disposed on a second side of the pairs of target patterns opposite to the first side. The second conductive line is electrically connected to a bottom pattern of the $(aN+1)^{th}$ pair of target patterns in the pairs of target patterns.

The disclosure provides a semiconductor structure including multiple pairs of target patterns, a first conductive line, and a second conductive line. Each of the pairs of target patterns includes a top pattern and a bottom pattern. The first conductive line is disposed on a first side of the pairs of target patterns. The first conductive line is electrically connected to a top patterns of a $(aN+2)^{th}$ pair of target patterns in the pairs of target patterns. a is a fixed integer greater than or equal to 2 and N is an integer greater than or equal to 0. The second conductive line is disposed on a second side of the pairs of target patterns opposite to the first side. The second conductive line is electrically connected to a bottom pattern of a $(aN+1)^{th}$ pair of target patterns in the pairs of target patterns.

Based on the above, according to embodiments of the disclosure, the first conductive line is electrically connected to the top pattern of the $(aN+1)^{th}$ pair of target patterns in the pairs of target patterns. a is a fixed integer greater than or equal to 2 and N is an integer greater than or equal to 0. In addition, the second conductive line is electrically connected to the bottom pattern of the $(aN+1)^{th}$ pair of target patterns in the pairs of target patterns. In this case, the structural homogeneity of the core pattern can be detected by the core capacitance value and/or gap capacitance value obtained from electrical inspection to ensure the stability of the semiconductor process and the quality of the semiconductor wafers. In addition, the method of electrically inspecting semiconductor structures may automate and inspect a large number of semiconductor structures to effectively improve yields and increase throughput.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
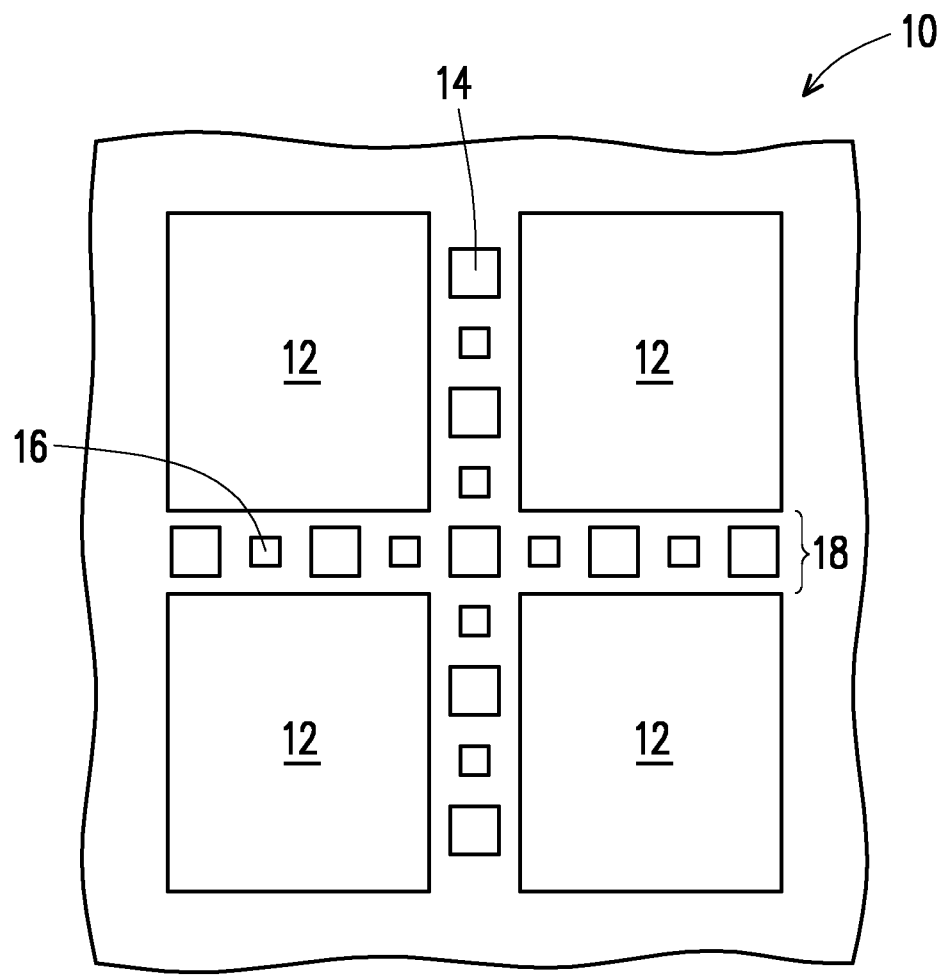
FIG. 1 is a schematic top view of a semiconductor wafer according to an embodiment of the disclosure.

The disclosure is more fully described by reference to the drawings of the embodiments. However, the disclosure may also be embodied in various forms and should not be limited to the embodiments described herein. The thickness of the layers and areas in the drawings are enlarged for clarity. The same or similar reference numerals refer to the same or similar elements, and will not be repeated in the following.

FIG. 1 is a schematic top view of a semiconductor wafer according to an embodiment of the disclosure.

Referring to FIG. 1, an embodiment of the disclosure provides a semiconductor wafer 10. In detail, the semiconductor wafer 10 has multiple dies 12, test pads 14, and test keys 16. According to some embodiments, the test pads 14 and the test keys 16 are disposed in an interactive arrangement in a scribe line 18 between the dies 12. The test pads 14 may be electrically connected to the test keys 16 to measure the electrical properties of the test keys 16, thus ensuring the stability of the semiconductor process and the quality of the semiconductor wafer, and further improving the yield. According to some embodiments, a wafer acceptable test (WAT) may be performed on the test pads 14 to test the quality of the semiconductor wafer 10.

FIG. 2A to FIG. 2F are three-dimensional schematic views of a manufacturing process of a semiconductor structure according to an embodiment of the disclosure.

According to this embodiment, a self-aligning double patterning (SADP) method is used as an example to illustrate the manufacturing process of the semiconductor structure, but the disclosure is not limited thereto. According to other embodiments, a self-aligning quadruple patterning (SAQP) method may also be used to form the semiconductor structure to increase the layout density (or pattern density) of the semiconductor structure for a more flexible layout design. In addition, according to some embodiments, the semiconductor structure may include contacts for a memory element, a landing pad, a capacitor, an embedded word line structure, an active region of dynamic random access memory (DRAM), or a combination thereof.

Figure 2A:
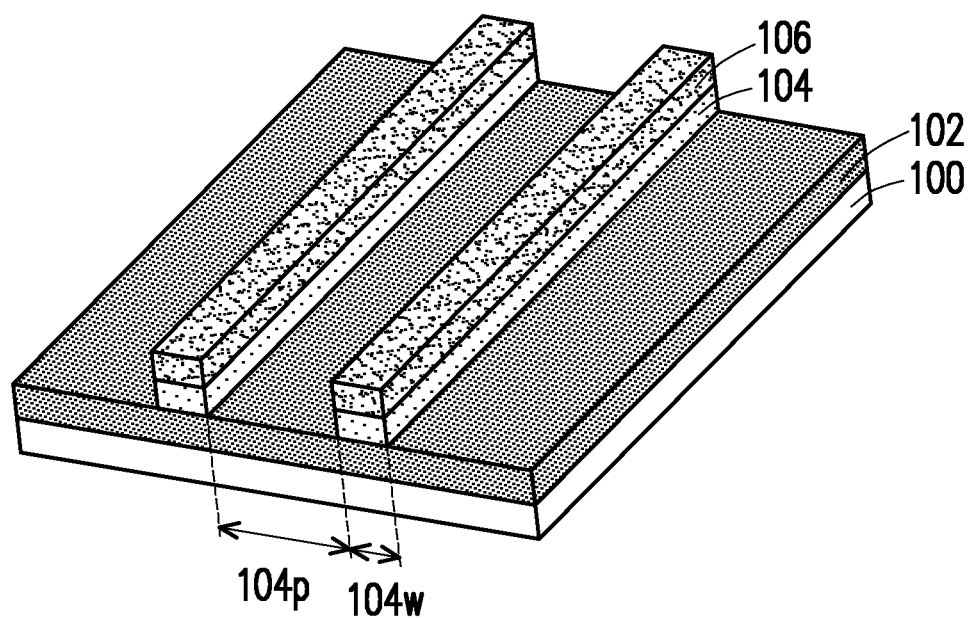
FIG. 2A to FIG. 2F are three-dimensional schematic views of a manufacturing process of a semiconductor structure according to an embodiment of the disclosure.

Referring to FIG. 2A, first, a target layer 102 is formed on a substrate 100. According to some embodiments, the target layer 102 may be a polysilicon layer that may be used as a contact for the memory element. However, the disclosure is not limited thereto. According to other embodiments, the target layer 102 may also be a metal layer (e.g., a tungsten layer), a silicon substrate, a dielectric layer, or a combination thereof.

Next, a core pattern 104 and a mask pattern 106 are sequentially formed on the target layer 102. According to one embodiment, a material of the core pattern 104 may include a dielectric material, such as tetraethoxysilane (TEOS), silicon oxide, or a combination thereof. According to one embodiment, the mask pattern 106 may include a single-layer structure or a multi-layer structure. For example, the mask pattern 106 may include a carbide layer and an anti-reflection layer on the carbide layer. A material of the carbide layer may include spin-on-carbon (SoC); and a material of the anti-reflection layer may include silicon oxynitride. As shown in FIG. 2A, the core pattern 104 and the mask pattern 106 may have the same width. That is, a side wall of the core pattern 104 may be aligned with a side wall of the mask pattern 106. A width 104w of the core pattern 104 and/or a spacing 104p between adjacent core patterns 104 may be adjusted according to requirements, and the disclosure is not limited thereto.

Figure 2B:
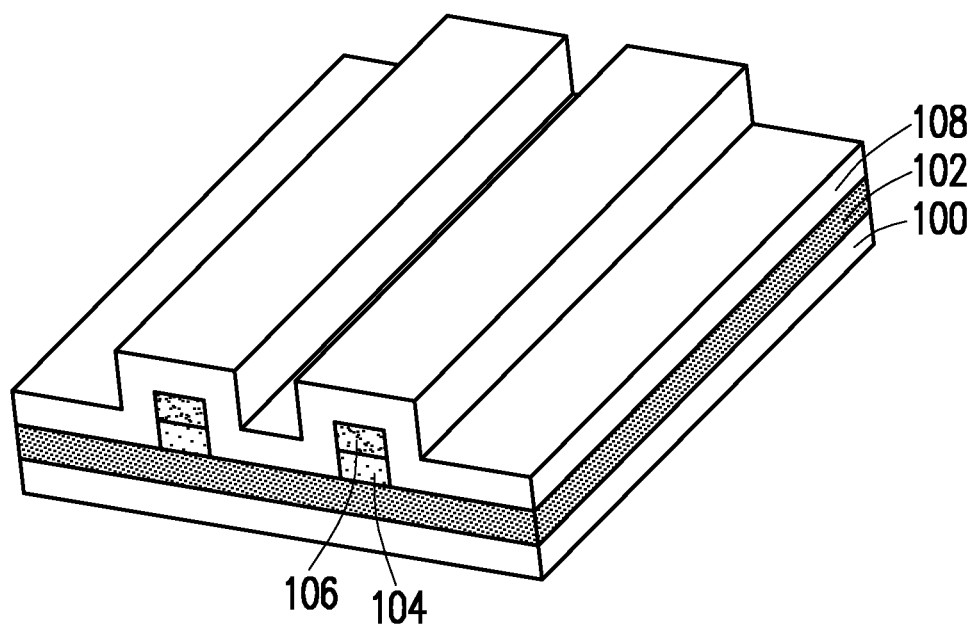

Referring to FIG. 2B, a spacer material 108 is formed on the target layer 102, the core pattern 104, and the mask pattern 106. In detail, the spacer material 108 conformally covers surfaces of the target layer 102, the core pattern 104, and the mask pattern 106. According to one embodiment, the spacer material 108 may be a dielectric material, such as silicon oxide, silicon nitride, silicon oxynitride, or a combination thereof.

Figure 2C:
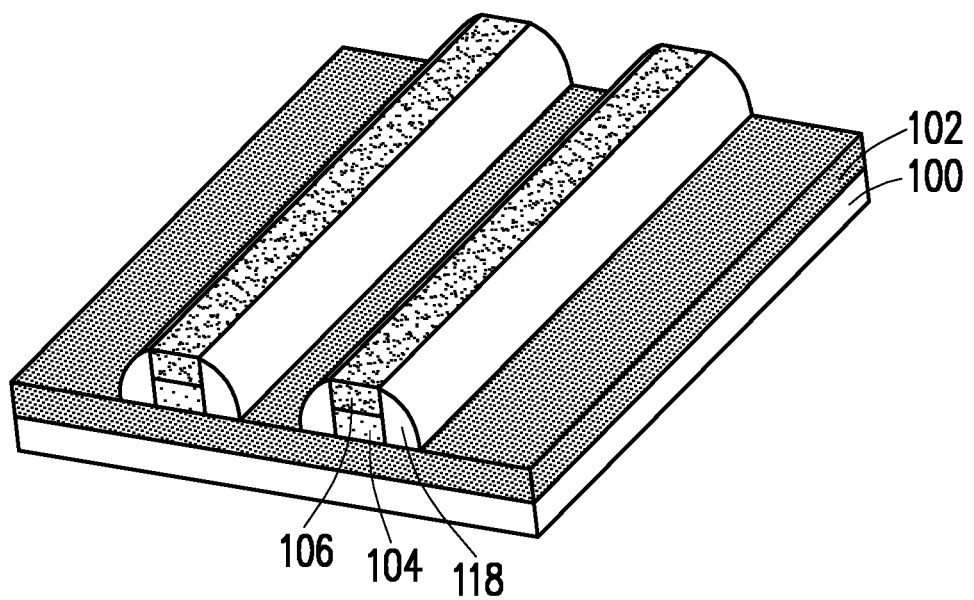

Referring to FIG. 2B and FIG. 2C, a portion of the spacer material 108 is removed to form a spacer 118 on the side wall of the core pattern 104 and the side wall of the mask pattern 106. According to one embodiment, the spacer material 108 on a top surface of the mask pattern 106 and on a top surface of the target layer 102 may be removed by an anisotropic etching process (e.g., reactive-ion etching (RIE)), thereby forming a spacer 118.

Figure 2D:
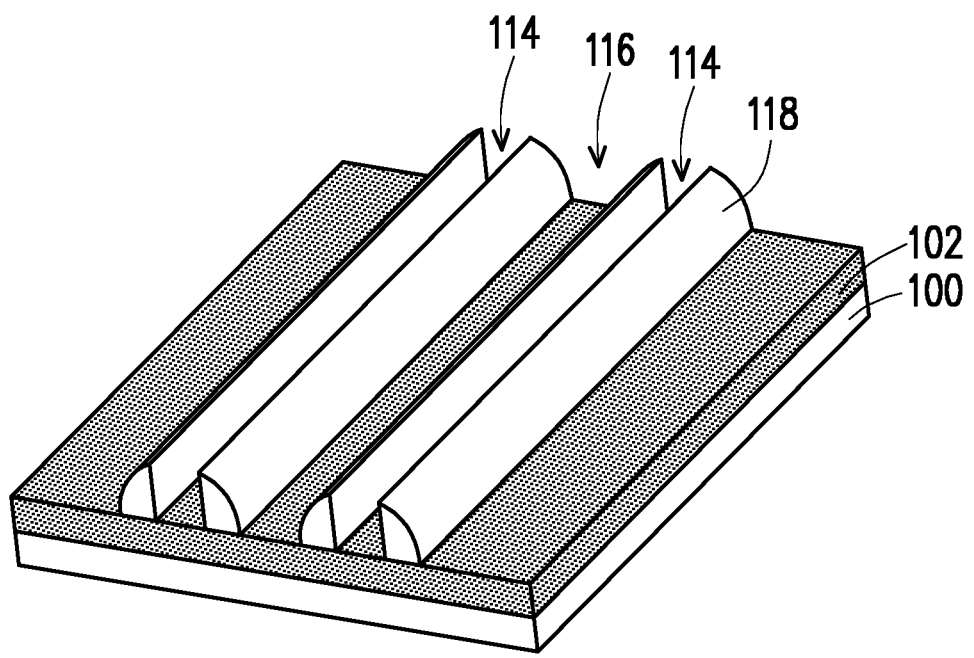

Referring to FIG. 2D, the mask pattern 106 and the core pattern 104 are removed to form an opening 114 between the spacers 118. The opening 114 exposes a top surface of target layer 102. In this case, as shown in FIG. 2D, the opening 114 between a pair of spacers 118 may be considered a core opening 114; and an opening 116 between an adjacent pair of spacers 118 may be considered a gap opening 116.

Figure 2E:
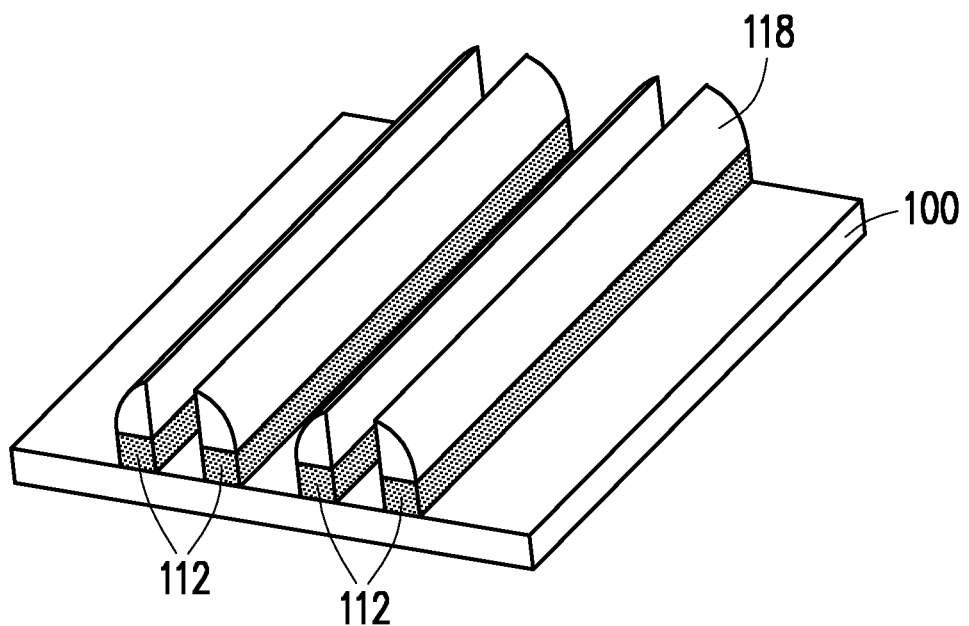

Referring to FIGS. 2D and 2E, the target pattern 112 is formed by removing a portion of the target layer 102 with the spacer 118 as a mask. According to one embodiment, the target layer 102 not covered by the spacer 118 may be removed by the anisotropic etching process (e.g., RIE), thereby forming the target pattern 112.

Figure 2F:
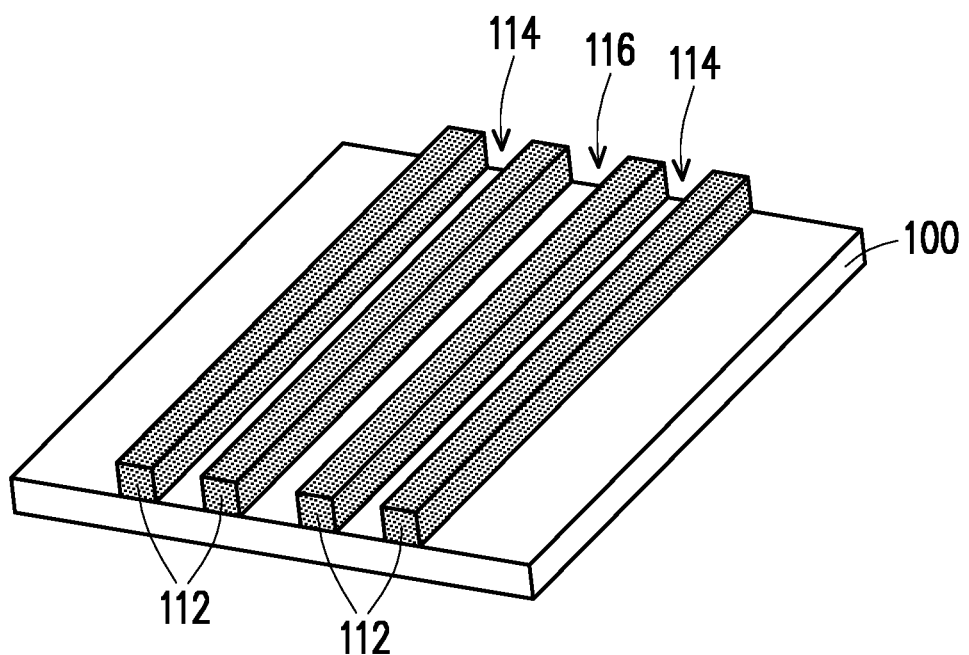

Referring to FIG. 2E and FIG. 2F, the spacer 118 is removed to leave the target pattern 112 on the substrate 100.

In detail, as shown in FIG. 2F, each of pair of target patterns 112 has a core opening 114 therebetween; and adjacent pairs of the target patterns 112 have a gap opening 116 therebetween. According to this embodiment, the layout density (or pattern density) of the target pattern 112 may be greater than the layout density (or pattern density) of the core pattern 104. That is, the layout density (or pattern density) of the semiconductor structure may be increased or decreased to achieve a more flexible layout design after the self-aligning double patterning (SADP) method according to this embodiment.

In addition, according to this embodiment, the structural uniformity of the core pattern 104 may be detected by measuring a core capacitance value of the target pattern 112 on both sides of the core opening 114 or by measuring a gap capacitance value of the target pattern 112 on both sides of the gap opening 116. This structural uniformity may refer generally to the width 104w of the core pattern 104 in FIG. 2A and/or the spacing 104p between the adjacent core patterns 104. The following describes in detail how to measure the core capacitance value of the target pattern 112 on both sides of the core opening 114 or the gap capacitance value of the target pattern 112 on both sides of the gap opening 116.

Figure 3A:
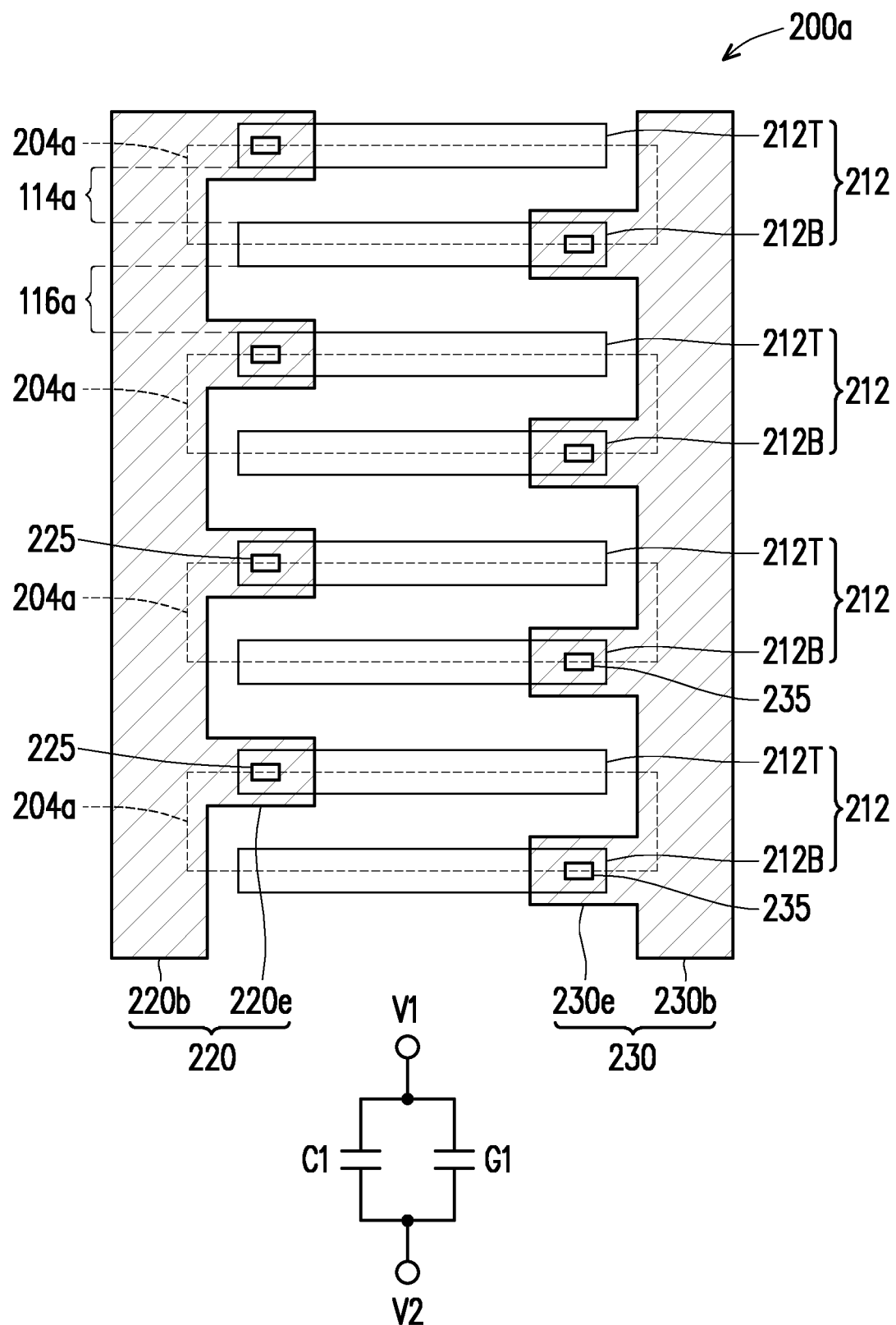
FIG. 3A to FIG. 3C are schematic top views of a semiconductor structure according to a first embodiment of the disclosure, respectively.
Figure 3B:
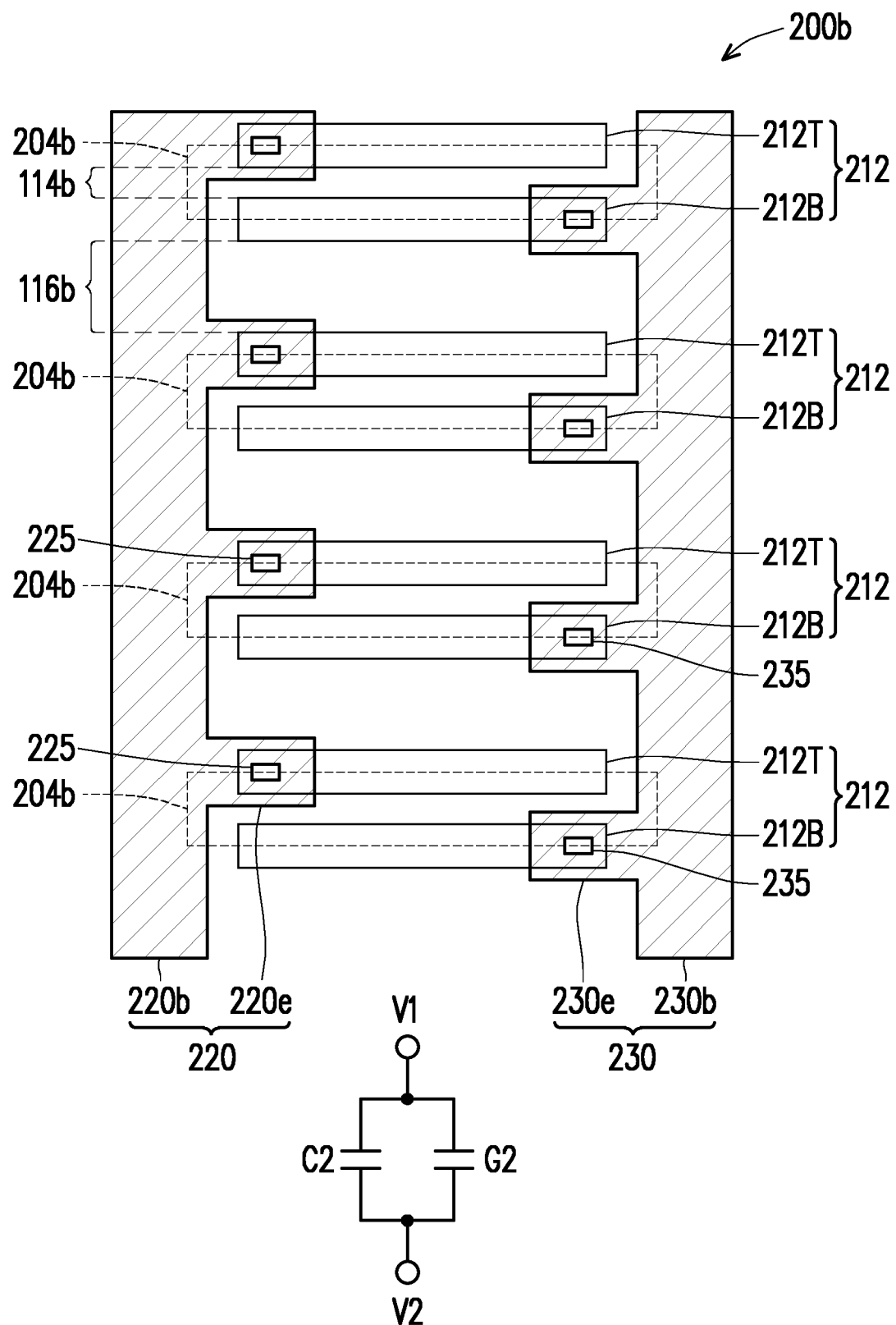
Figure 3C:
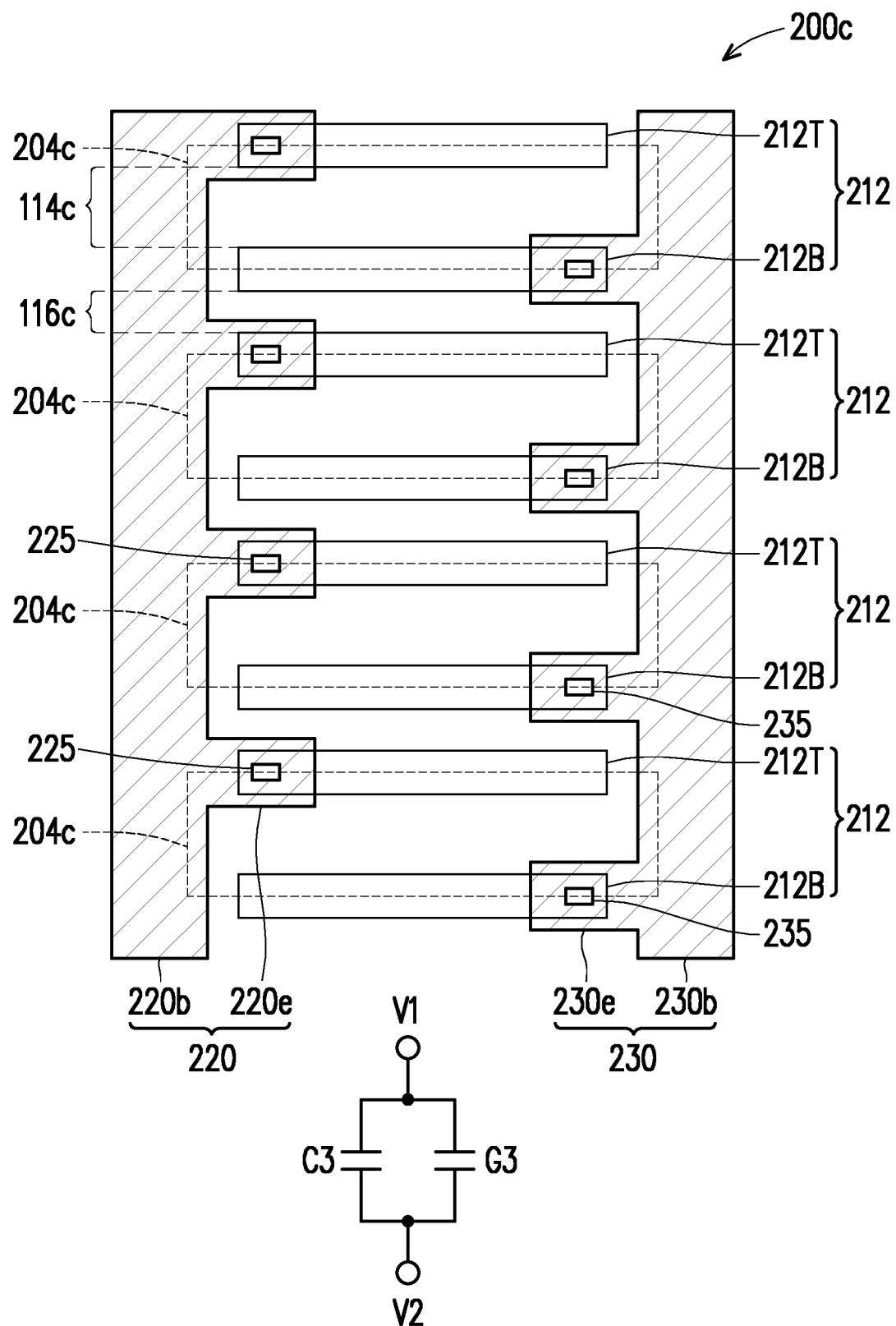

FIG. 3A to FIG. 3C are schematic top views of a semiconductor structure according to a first embodiment of the disclosure, respectively. According to this embodiment, semiconductor structures 200a, 200b, and 200c may be disposed in the test key 16 of FIG. 1, and the electrical properties of the semiconductor structures 200a, 200b, and 200c may be measured through the test pad 14 electrically connected to the test key 16.

Referring to FIG. 3A, the semiconductor structure 200a includes multiple pairs of target patterns 212. Each of the pairs of target patterns 212 may include a top pattern 212T and a bottom pattern 212B. There is a core opening 114a between the top pattern 212T and the bottom pattern 212B; and a gap opening 116a between adjacent pairs of the target patterns 212. According to one embodiment, the target pattern 212 is formed by the SADP process described in FIG. 2A to FIG. 2F. Thus, the location of the core opening 114a may correspond to the location of a core pattern 204a. Since the core pattern 204a is not physically present in FIG. 3A, it is shown as dashed lines.

It should be noted that, according to this embodiment, the target pattern 212 may be electrically connected to conductive lines 220 and 230 respectively to measure the capacitance value between the target patterns 212, so as to detect the structural uniformity of the core pattern 204a. Specifically, as shown in FIG. 3A, the conductive line 220 may be disposed on a first side of the target pattern 212 and electrically connected to the top pattern 212T through a contact 225. According to one embodiment, the conductive line 220 includes a main body 220b and multiple extensions 220e connecting the main body 220b. From the top view FIG. 3A, the extension 220e extends from a side wall of the main body 220b and covers a portion of the top pattern 212T. The contact 225 is vertically disposed between the extension 220e and the top pattern 212T to couple the extension 220e and the top pattern 212T. Similarly, the conductive line 230 may be disposed on a second side of the target pattern 212 opposite to the first side, and is electrically connected to the bottom pattern 212B through the contact 235. According to one embodiment, the conductive line 230 includes a main body 230b and multiple extensions 230e connecting the main body 230b. From the top view FIG. 3A, the extension 230e extends from a side wall of the main body 230b and covers a portion of the bottom pattern 212B. The contact 235 is vertically disposed between the extension 230e and the bottom pattern 212B to couple the extension 230e and the bottom pattern 212B.

According to this embodiment, during electrical inspection, a voltage V1 (e.g., 2V) may be applied to the conductive line 220, and a voltage V2 (e.g., 0V or ground) different from the voltage V1 may be applied to the conductive line 230. In this case, the staggered extensions 220e and the extensions 230e measure a core capacitance value C1 between the top pattern 212T and the bottom pattern 212B, and measure a gap capacitance value G1 between the adjacent pairs of the target patterns 212.

Referring to FIG. 3B, basically, the semiconductor structure 200b is similar to the semiconductor structure 200a. The difference is that a width of a core pattern 204b of the semiconductor structure 200b is smaller than a width of the core pattern 204a of the semiconductor structure 200a. That is, a width of a core opening 114b of the semiconductor structure 200b is smaller than a width of the core opening 114a of the semiconductor structure 200a; a width of a gap opening 116b of the semiconductor structure 200b is larger than a width of the gap opening 116a of the semiconductor structure 200a. According to this embodiment, a core capacitance value C2 between the top pattern 212T and the bottom pattern 212B of the semiconductor structure 200b is increased to be greater than the core capacitance value C1 of the semiconductor structure 200a; a gap capacitance value G2 between the adjacent pairs of the target patterns 212 of the semiconductor structure 200b is reduced to be smaller than the gap capacitance value G1 of the semiconductor structure 200a.

Since the core capacitance value C2 increases and the gap capacitance value G2 decreases accordingly, a total capacitance value of the semiconductor structure 200b may be substantially equal to a total capacitance value of the semiconductor structure 200a. In this case, the electrical inspection does not substantially detect the structural uniformity of the core pattern.

Similarly, as shown in FIG. 3C, a width of the core pattern 204c of the semiconductor structure 200c is greater than the width of the core pattern 204a of the semiconductor structure 200a. That is, a width of a core opening 114c of the semiconductor structure 200c is greater than the width of the core opening 114a of the semiconductor structure 200a; a width of a gap opening 116c of the semiconductor structure 200c is smaller than the width of the gap opening 116a of the semiconductor structure 200a. According to this embodiment, a core capacitance value C3 between the top pattern 212T and the bottom pattern 212B of the semiconductor structure 200c is reduced to be smaller than the core capacitance value C1 of the semiconductor structure 200a; a gap capacitance value G3 between the adjacent pairs of the target patterns 212 of the semiconductor structure 200c is increased to be greater than the gap capacitance value G1 of the semiconductor structure 200a. Since the core capacitance value C3 decreases and the gap capacitance value G3 increases accordingly, a total capacitance value of the semiconductor structure 200c may be substantially equal to the total capacitance value of the semiconductor structure 200a. In this case, the electrical inspection does not substantially detect the structural uniformity of the core pattern.

Figure 4A:
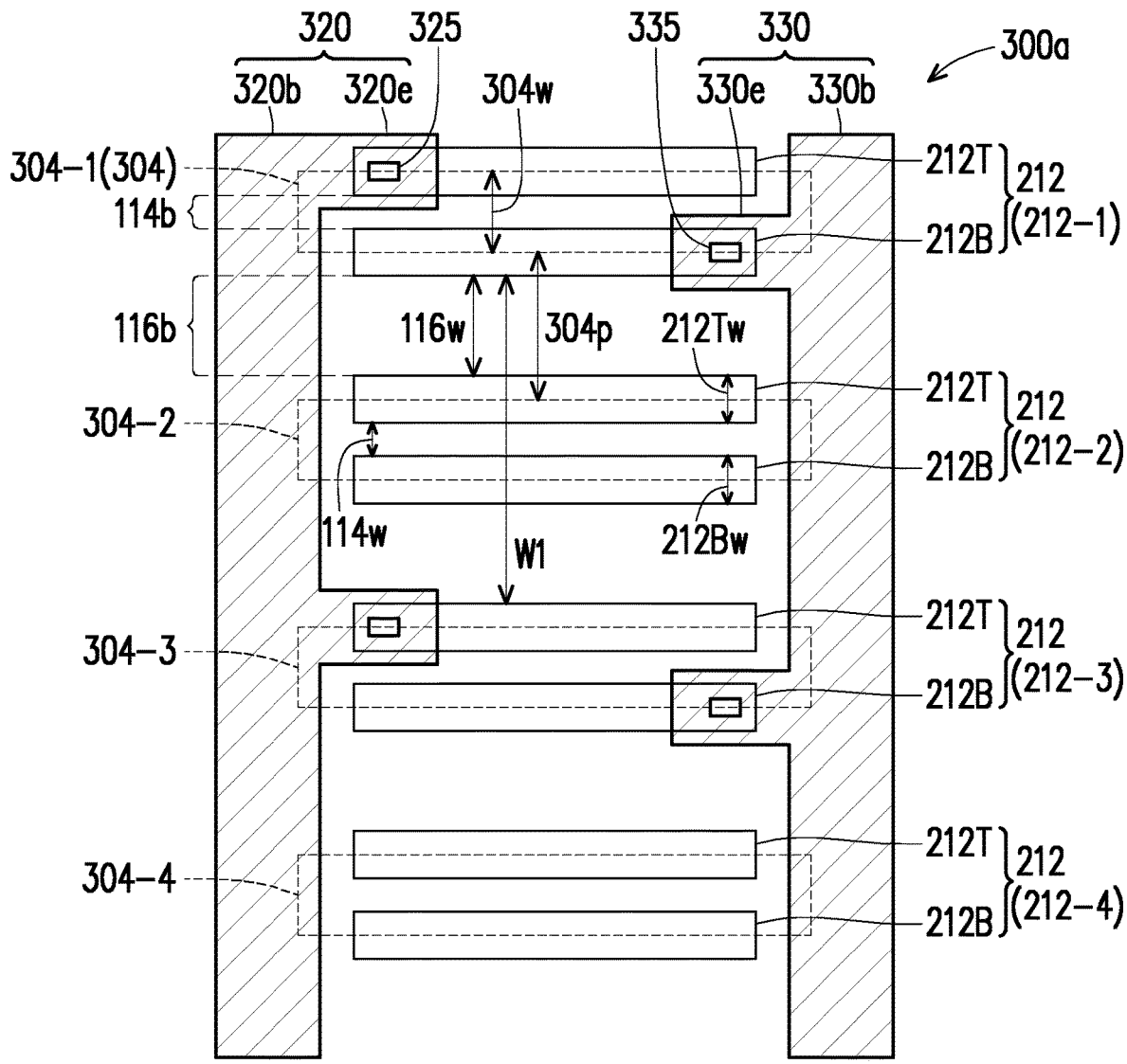
FIG. 4A and FIG. 4B are schematic top views of a semiconductor structure according to a second embodiment of the disclosure, respectively.
Figure 4B:
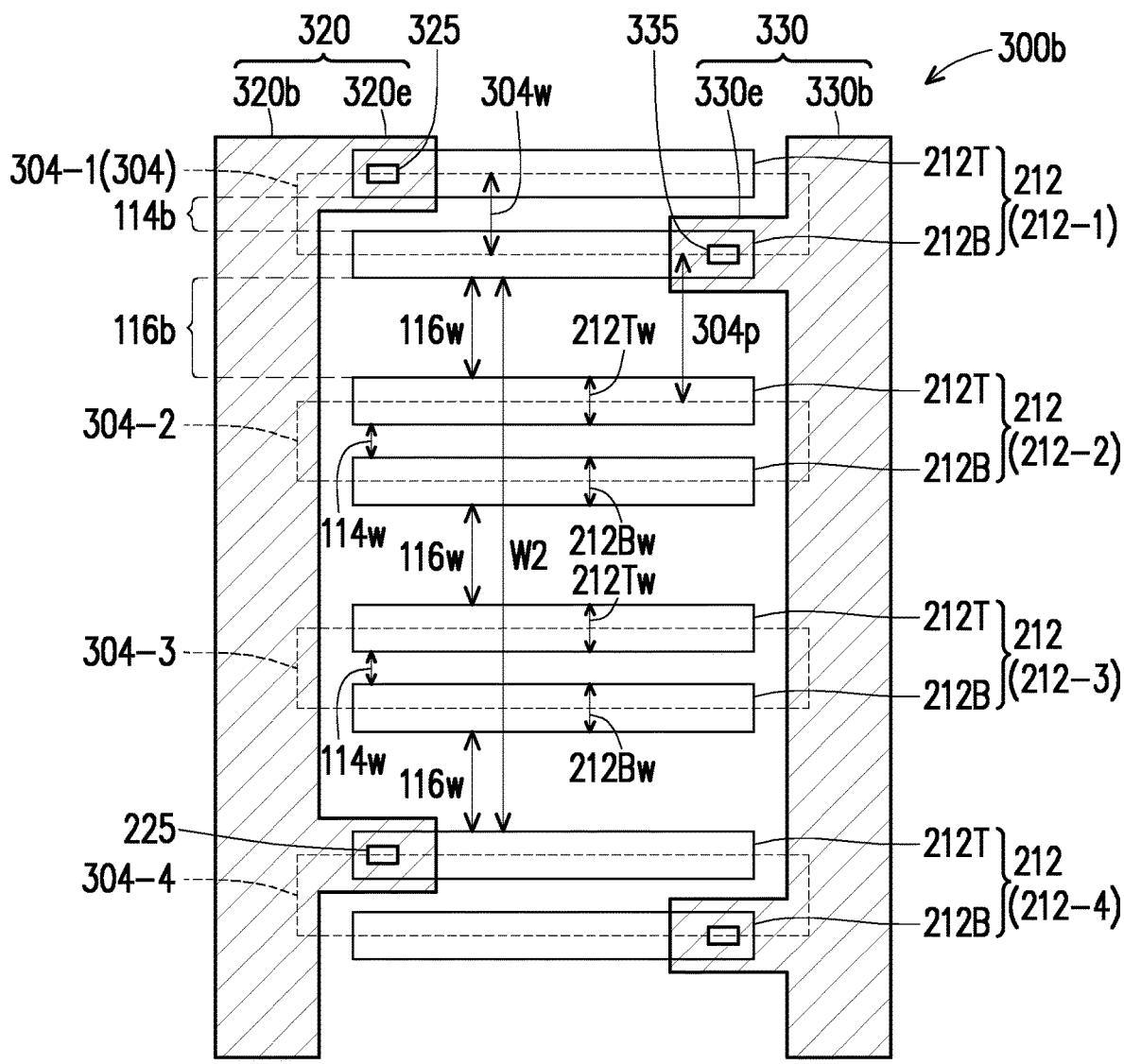
Figure 4B:
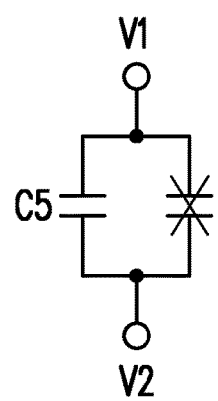

FIG. 4A and FIG. 4B are schematic top views of a semiconductor structure according to a second embodiment of the disclosure, respectively. According to this embodiment, semiconductor structures 300a and 300b may be disposed in the test key 16 of FIG. 1, and the electrical properties of the semiconductor structures 300a and 300b may be measured through the test pad 14 electrically connected to the test key 16.

Referring to FIG. 4A, basically, the semiconductor structure 300a is similar to the semiconductor structure 200b. The difference is that the configuration of conductive lines 320 and 330 of the semiconductor structure 300a is different from the configuration of the conductive lines 220 and 230 of the semiconductor structure 200b. Specifically, the conductive line 320 is disposed on the first side of the target pattern 212, and the conductive line 330 is disposed on the second side of the target pattern 212 opposite to the first side. From the top view FIG. 4A, the conductive line 320 (which may be considered a first conductive line) includes a main body 320b and multiple extensions 320e. The extensions 320e extend respectively from a side wall of the main body 320b and cover corresponding top patterns 212T. In addition, the conductive line 330 (which may be considered a second conductive line) includes a main body 330b and multiple extensions 330e. The extensions 330e extend respectively from a side wall of the main body 330b and cover corresponding bottom patterns 212B.

According to this embodiment, the conductive line 320 is electrically connected to the top pattern 212T of a first pair of target patterns 212-1 and the top pattern 212T of a third pair of target patterns 212-3 in the target patterns 212, while not electrically connected to a second pair of target patterns 212-2 and a fourth pair of target patterns 212-4. That is, the conductive line 320 may be electrically connected to the top pattern 212T of a $(aN+1)^{th}$ pair of target patterns in the pairs of target patterns 212, where a is a fixed integer greater than or equal to 2 and N is an integer greater than or equal to 0. According to some embodiments, when a is 2, the conductive line 320 may be electrically connected to the top pattern 212T of the first pair of target patterns, the top pattern 212T of the third pair of target patterns, and the top pattern 212T of a fifth pair of target patterns to the top pattern 212T of a $(2N+1)^{th}$ pair of target patterns in the pairs of target patterns 212.

On the other hand, the conductive line 330 may be electrically connected to the bottom pattern 212B of the first pair of target patterns 212-1 and the bottom pattern 212B of the third pair of target patterns 212-3 in the target pattern 212, while not electrically connected to the second pair of target patterns 212-2 and the fourth pair of target patterns 212-4. That is, the conductive line 330 is electrically connected to the bottom pattern 212B of the $(aN+1)^{th}$ pair of target patterns in the pairs of target patterns, where a is a fixed integer greater than or equal to 2 and N is an integer greater than or equal to 0. According to some embodiments, when a is 2, the conductive line 330 may be electrically connected to the bottom pattern 212B of the first pair of target patterns, the bottom pattern 212B of the third pair of target patterns, and the bottom pattern 212B of the fifth pair of target patterns to the bottom pattern 212B of the $(2N+1)^{th}$ pair of target patterns in the pairs of target patterns 212.

From another perspective, the extension 320e and the extension 330e are electrically connected to a core pattern 304-1 as well as the top pattern 212T and the bottom pattern 212B on both sides of a core pattern 304-3 through contacts 325 and 335, respectively, while not electrically connected to a core pattern 304-2 as well as the top pattern 212T and the bottom pattern 212B on both sides of a core pattern 304-4. That is, the extension 320e and the extension 330e are respectively electrically connected to the top pattern 212T and the bottom pattern 212B on both sides of a $(aN+1)^{th}$ core pattern, where a is a fixed integer greater than or equal to 2 and N is an integer greater than or equal to 0. According to some embodiments, when a is 2, the conductive lines 320 and 330 may be electrically connected to the top pattern 212T and the bottom pattern 212B on both sides of a first core pattern, the top pattern 212T and the bottom pattern 212B on both sides of a third core pattern, and the top pattern 212T and the bottom pattern 212B on both sides of a fifth core pattern to the top pattern 212T and the bottom pattern 212B on both sides of a $(2N+1)^{th}$ core pattern.

According to this embodiment, during electrical inspection, a voltage V1 (e.g., 2V) may be applied to the conductive line 320, and a voltage V2 (e.g., 0V or ground) different from the voltage V1 may be applied to the conductive line 330. In this case, the staggered extensions 320e and the extensions 330e measure a core capacitance value C4 of the first pair of target patterns 212-1 and the core capacitance value C4 of the third pair of target patterns 212-3. It should be noted that a distance W1 between the first pair of target patterns 212-1 and the third pair of target patterns 212-3 is approximately equal to the sum of a width 116w of two gap openings 116b, a width 114w of one core opening 114b, a width 212Tw of one top pattern 212T, and a width 212Bw of one bottom pattern 212B. In this case, the gap capacitance value between the first pair of target patterns 212-1 and the third pair of target patterns 212-3 is negligibly small because the distance W1 is too large. Therefore, a total capacitance value of the semiconductor structure 300a may be substantially equal to the core capacitance value C4. According to this embodiment, the structural uniformity of the core pattern 304 may be detected by electrically inspecting the core capacitance value C4. That is, a change of a width 304w of the core pattern 304 and/or a change of a spacing 304p between adjacent core patterns 304 may be detected by the core capacitance value C4 obtained by electrical inspection. For example, when the core capacitance value C4 becomes larger, it can be assumed that the width 304w of the core pattern 304 may become smaller. In this case, the structure of the target patterns 212 may be visually inspected in-line to ensure the stability of the semiconductor process and the quality of the semiconductor wafers. In addition, the method of electrically inspecting semiconductor structures may automate and inspect a large number of semiconductor structures to effectively improve yields and increase throughput.

Referring to FIG. 4B, basically, the semiconductor structure 300b is similar to the semiconductor structure 300a. The difference is that the configuration of the conductive lines 320 and 330 of the semiconductor structure 300b is different. Specifically, the conductive line 320 is electrically connected to the top pattern 212T of the first pair of target patterns 212-1 and the top pattern 212T of the fourth pair of target patterns 212-4 in the pairs of target patterns 212. That is, the conductive line 320 is electrically connected to the top pattern 212T of the $(aN+1)^{th}$ pair of target patterns in the pairs of target patterns 212, where a is a fixed integer greater than or equal to 3 and N is an integer greater than or equal to 0. According to some embodiments, when a is 3, the conductive line 320 may be electrically connected to the bottom pattern 212B of the first pair of target patterns, the bottom pattern 212B of the fourth pair of target patterns, and the bottom pattern 212B of a seventh pair of target patterns to the bottom pattern 212B of a $(3N+1)^{th}$ pair of target patterns in the pairs of target patterns 212.

On the other hand, the conductive line 330 is electrically connected to the bottom pattern 212B of the first pair of target patterns 212-1 and the bottom pattern 212B of the fourth pair of target patterns 212-4 in the target patterns 212. That is, the conductive line 330 is electrically connected to the bottom pattern 212B of the $(aN+1)^{th}$ pair of target patterns in the pairs of target patterns, where a is a fixed integer greater than or equal to 3 and N is an integer greater than or equal to 0. According to some embodiments, when a is 3, the conductive line 330 may be electrically connected to the bottom pattern 212B of the first pair of target patterns, the bottom pattern 212B of the fourth pair of target patterns, and the bottom pattern 212B of the seventh pair of target patterns to the bottom pattern 212B of the $(3N+1)^{th}$ pair of target patterns in the pairs of target patterns 212.

It should be noted that a distance W2 between the first pair of target patterns 212-1 and the fourth pair of target patterns 212-4 is approximately equal to the sum of a width 116w of three gap openings 116b, a width 114w of two core openings 114b, a width 212Tw of two top patterns 212T, and a width 212Bw of two bottom patterns 212B. In this case, the gap capacitance value between the first pair of target patterns 212-1 and the fourth pair of target patterns 212-4 is negligibly small because the distance W2 is too large. Therefore, a total capacitance value of the semiconductor structure 300b may be substantially equal to the core capacitance value C5. According to this embodiment, the structural uniformity of the core pattern 304 may be detected by electrically inspecting the core capacitance value C5. That is, a change of a width 304w of the core pattern 304 and/or a change of a spacing 304p between adjacent core patterns 304 may be detected by the core capacitance value C5 obtained by electrical inspection.

Figure 5A:
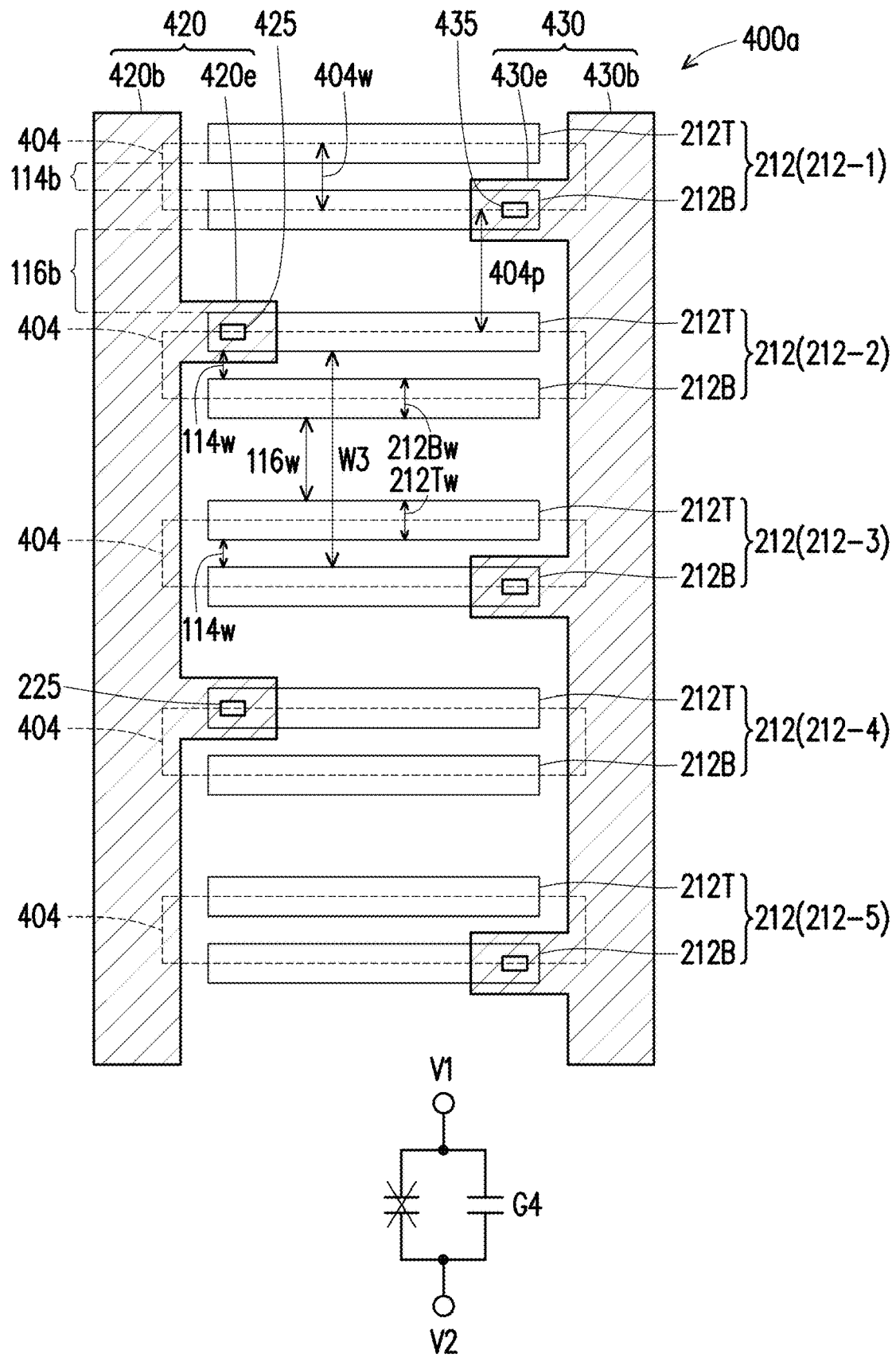
FIG. 5A and FIG. 5B are schematic top views of a semiconductor structure according to a third embodiment of the disclosure, respectively.
Figure 5B:
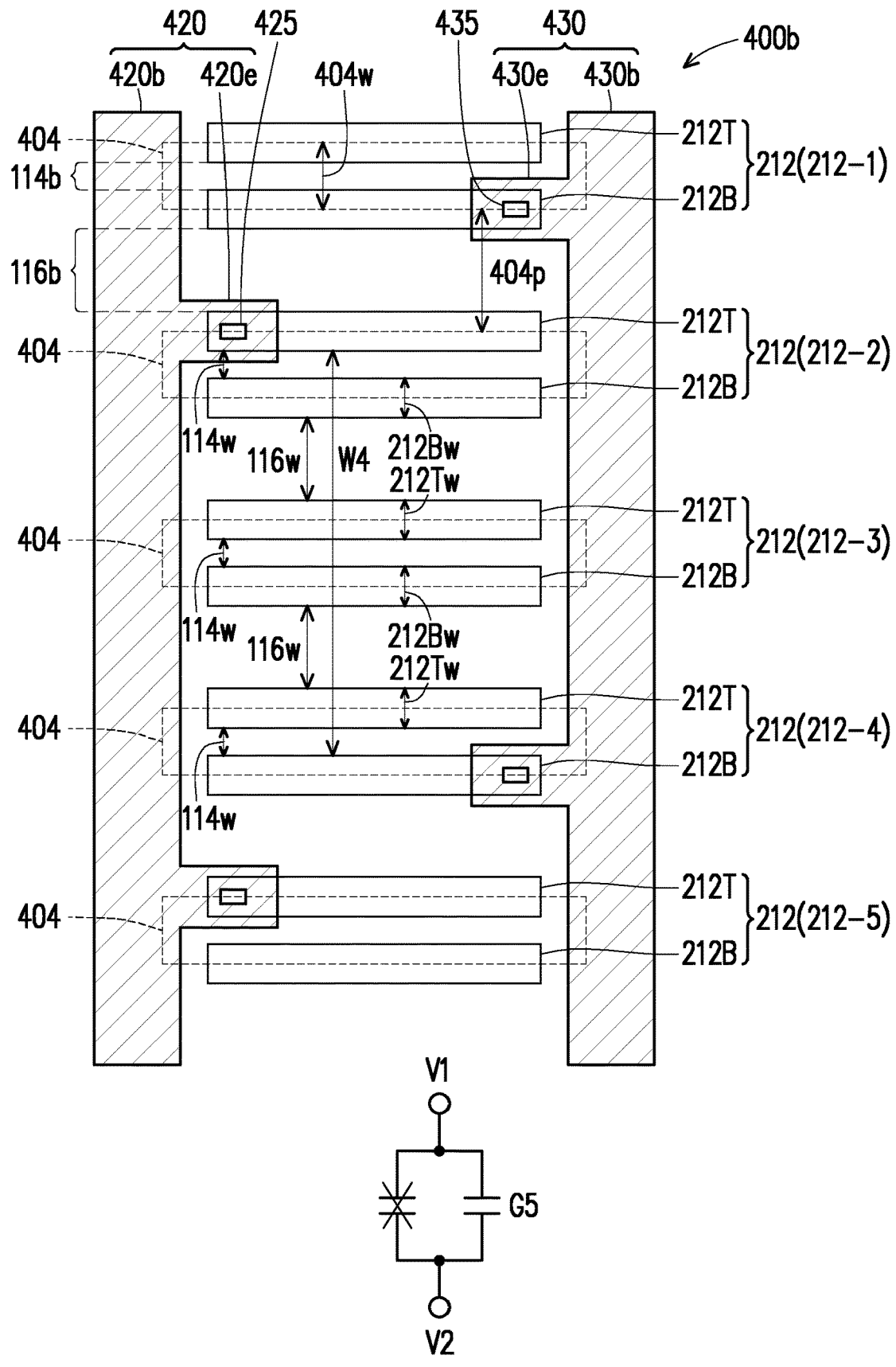

FIG. 5A and FIG. 5B are schematic top views of a semiconductor structure according to a third embodiment of the disclosure, respectively. According to this embodiment, semiconductor structures 400a and 400b may be disposed in the test key 16 of FIG. 1, and the electrical properties of the semiconductor structures 400a and 400b may be measured through the test pad 14 electrically connected to the test key 16.

Basically, the semiconductor structure 400a is similar to the semiconductor structure 200b. The difference is that the configuration of conductive lines 420 and 430 of the semiconductor structure 400a is different from the configuration of the conductive lines 220 and 230 of the semiconductor structure 200b. Specifically, the conductive line 420 is disposed on the first side of the target pattern 212, and the conductive line 430 is disposed on the second side of the target pattern 212 opposite to the first side. From the top view FIG. 5A, the conductive line 420 (which may be considered a first conductive line) includes a main body 420b and multiple extensions 420e. The extensions 420e extend respectively from a side wall of the main body 420b and cover corresponding top patterns 212T. In addition, the conductive line 430 (which may be considered a second conductive line) includes a main body 430b and multiple extensions 430e. The extensions 430e extend respectively from a side wall of the main body 430b and cover corresponding bottom patterns 212B.

According to this embodiment, the conductive line 420 is electrically connected to the top pattern 212T of the second pair of target patterns 212-2 and the top pattern 212T of the fourth pair of target patterns 212-4 in the target patterns 212. That is, the conductive line 420 may be electrically connected to the top pattern 212T of the $(aN+2)^{th}$ pair of target patterns in the pairs of target patterns 212, where a is a fixed integer greater than or equal to 2 and N is an integer greater than or equal to 0. According to some embodiments, when a is 2, the conductive line 420 may be electrically connected to the top pattern 212T of the second pair of target patterns, the top pattern 212T of the fourth pair of target patterns, and the top pattern 212T of a sixth pair of target patterns to the top pattern 212T of a $(2N+2)^{th}$ pair of target patterns in the pairs of target patterns 212.

On the other hand, the conductive line 430 may be electrically connected to the bottom pattern 212B of the first pair of target patterns 212-1 and the bottom pattern 212B of the third pair of target patterns 212-3 in the target pattern 212. That is, the conductive line 430 is electrically connected to the bottom pattern 212B of the $(aN+1)^{th}$ pair of target patterns in the pairs of target patterns, where a is a fixed integer greater than or equal to 2 and N is an integer greater than or equal to 0. According to some embodiments, when a is 2, the conductive line 430 may be electrically connected to the bottom pattern 212B of the first pair of target patterns, the bottom pattern 212B of the third pair of target patterns, and the bottom pattern 212B of the fifth pair of target patterns to the bottom pattern 212B of the $(2N+1)^{th}$ pair of target patterns in the pairs of target patterns 212.

According to this embodiment, during electrical inspection, a voltage V1 (e.g., 2V) may be applied to the conductive line 420, and a voltage V2 (e.g., 0V or ground) different from the voltage V1 may be applied to the conductive line 430. In this case, the staggered extensions 420e and the extensions 430e measure a gap capacitance value G4 between the first pair of target patterns 212-1 and the second pair of target patterns 212-2, and measures the gap capacitance value G4 between the third pair of target patterns 212-3 and the fourth pair of target patterns 212-4.

It should be noted that a distance W3 between the second pair of target patterns 212-2 and the third pair of target patterns 212-3 is approximately equal to the sum of a width 114w of two core openings 114b, a width 116w of one gap opening 116b, a width 212Tw of one top pattern 212T, and a width 212Bw of one bottom pattern 212B. In this case, the core capacitance value between the second pair of target patterns 212-2 and the third pair of target patterns 212-3 is negligibly small because the distance W3 is too large. Therefore, a total capacitance value of the semiconductor structure 400a may be substantially equal to the gap capacitance value G4. According to this embodiment, the structural uniformity of a core pattern 404 may be detected by electrically inspecting the gap capacitance value G4. That is, a change of a width 404w of the core pattern 404 and/or a change of a spacing 404p between adjacent core patterns 404 may be detected by the gap capacitance value G4 obtained by electrical inspection. For example, when the gap capacitance value G4 becomes larger, it can be assumed that the spacing 404p of the core pattern 404 may become smaller. In this case, the structure of the target patterns 212 may be visually inspected in-line to ensure the stability of the semiconductor process and the quality of the semiconductor wafers. In addition, the method of electrically inspecting semiconductor structures may automate and inspect a large number of semiconductor structures to effectively improve yields and increase throughput.

Referring to FIG. 5B, basically, the semiconductor structure 400b is similar to the semiconductor structure 400a. The difference is that the configuration of the conductive lines 420 and 430 of the semiconductor structure 400b is different. Specifically, the conductive line 420 is electrically connected to the top pattern 212T of the second pair of target patterns 212-2 and the top pattern 212T of the fifth pair of target patterns 212-5 in the pairs of target patterns 212. That is, the conductive line 420 is electrically connected to the top pattern 212T of the $(aN+2)^{th}$ pair of target patterns in the pairs of target patterns 212, where a is a fixed integer greater than or equal to 3 and N is an integer greater than or equal to 0. According to some embodiments, when a is 3, the conductive line 420 may be electrically connected to the bottom pattern 212B of the second pair of target patterns, the bottom pattern 212B of the fifth pair of target patterns, and the bottom pattern 212B of an eighth pair of target patterns to the bottom pattern 212B of a $(3N+2)^{th}$ pair of target patterns in the pairs of target patterns 212.

On the other hand, the conductive line 430 is electrically connected to the bottom pattern 212B of the first pair of target patterns 212-1 and the bottom pattern 212B of the fourth pair of target patterns 212-4 in the target patterns 212. That is, the conductive line 430 is electrically connected to the bottom pattern 212B of the $(aN+1)^{th}$ pair of target patterns in the pairs of target patterns, where a is a fixed integer greater than or equal to 3 and N is an integer greater than or equal to 0. According to some embodiments, when a is 3, the conductive line 430 may be electrically connected to the bottom pattern 212B of the first pair of target patterns, the bottom pattern 212B of the fourth pair of target patterns, and the bottom pattern 212B of the seventh pair of target patterns to the bottom pattern 212B of the $(3N+1)^{th}$ pair of target patterns in the pairs of target patterns 212.

It should be noted that a distance W4 between the second pair of target patterns 212-2 and the fourth pair of target patterns 212-4 is approximately equal to the sum of a width 116w of two gap openings 116b, a width 114w of three core openings 114b, a width 212Tw of two top patterns 212T, and a width 212Bw of two bottom patterns 212B. In this case, the core capacitance value between the second pair of target patterns 212-2, the third pair of target patterns 212-3, and the fourth pair of target patterns 212-4 is negligibly small because the distance W4 is too large. Therefore, a total capacitance value of the semiconductor structure 400b may be substantially equal to a gap capacitance value G5. According to this embodiment, a change of the width 404w of the core pattern 404 and/or a change of the spacing 404p between adjacent core patterns 404 may be detected by the gap capacitance value G5 obtained by electrical inspection.

Figure 6:
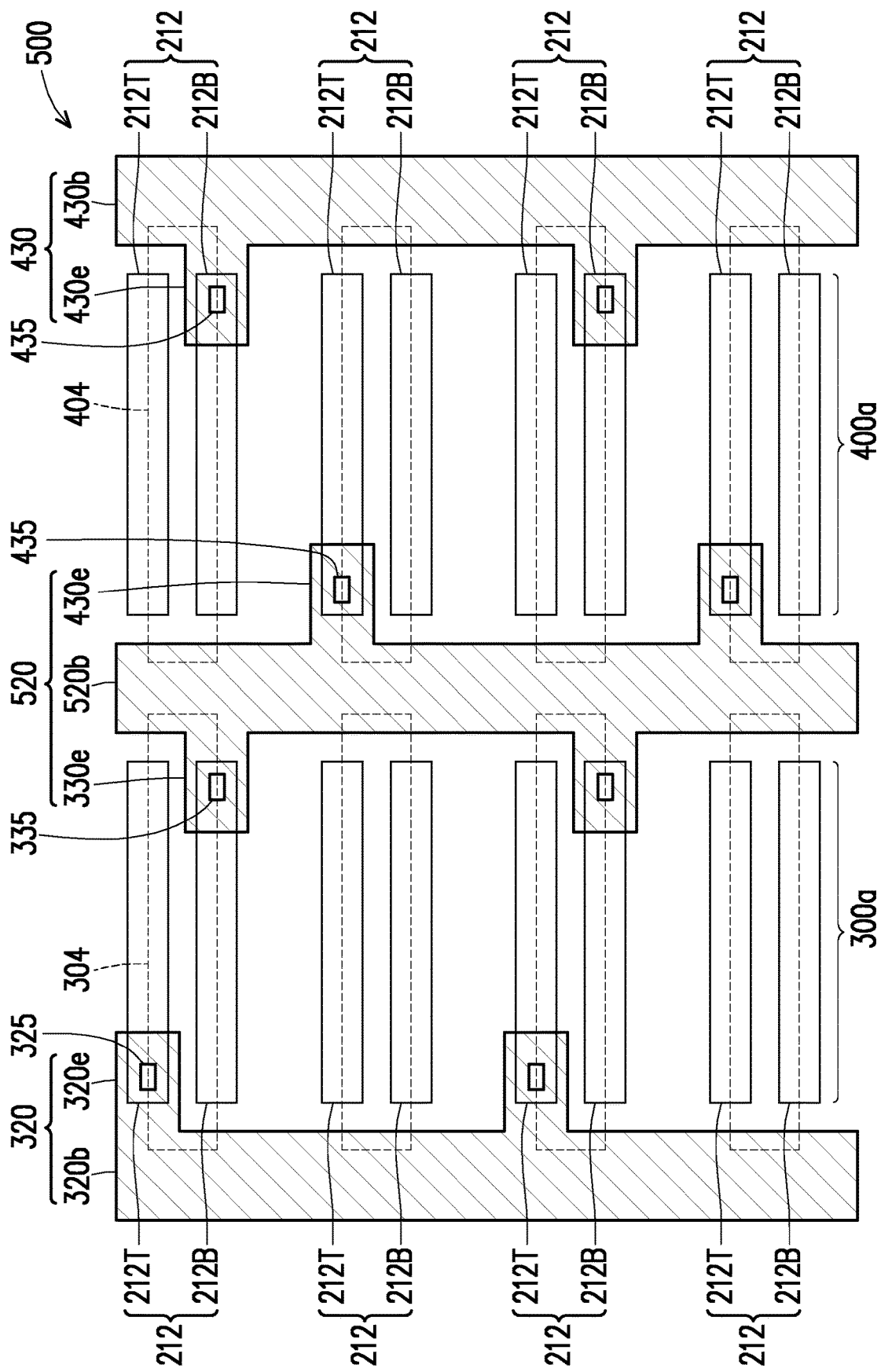
FIG. 6 is a schematic top view of a semiconductor structure according to a fourth embodiment of the disclosure.

FIG. 6 is a schematic top view of a semiconductor structure according to a fourth embodiment of the disclosure. According to this embodiment, a semiconductor structure 500 may be disposed in the test key 16 of FIG. 1, and the electrical properties of the semiconductor structures 500 may be measured through the test pad 14 electrically connected to the test key 16.

Referring to FIG. 6, basically, the semiconductor structure 500 is a structure obtained by combining the semiconductor structure 300a of FIG. 4A with the semiconductor structure 400a of FIG. 5A. According to one embodiment, the semiconductor structure 300a and the semiconductor structure 400a share a conductive line 520. Specifically, the conductive line 520 includes a main body 520b, multiple extensions 330e, and multiple extensions 430e. The extensions 330e extend respectively from a first side wall of the main body 520b and cover corresponding bottom patterns 212B. The extensions 430e extend respectively from a second side wall of the main body 520b and cover corresponding top patterns 212T. The extension 330e and the extension 430e are staggered with each other. According to this embodiment, the semiconductor structure 500 may save chip usage area by sharing the conductive line 520; however, the disclosure is not limited thereto. According to other embodiments, instead of sharing the conductive line 520, the semiconductor structure 300a of FIG. 4A and the semiconductor structure 400a of FIG. 5A may be disposed side-by-side.

To sum up, according to embodiments of the disclosure, the first conductive line is electrically connected to the top pattern of the $(aN+1)^{th}$ pair of target patterns in the pairs of target patterns. a is a fixed integer greater than or equal to 2 and N is an integer greater than or equal to 0. In addition, the second conductive line is electrically connected to the bottom pattern of the $(aN+1)^{th}$ pair of target patterns in the pairs of target patterns. In this case, the structural homogeneity of the core pattern can be detected by the core capacitance value and/or gap capacitance value obtained from electrical inspection to ensure the stability of the semiconductor process and the quality of the semiconductor wafers. In addition, the method of electrically inspecting semiconductor structures may automate and inspect a large number of semiconductor structures to effectively improve yields and increase throughput.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor structure comprising:
   a plurality of pairs of target patterns, wherein each of the plurality of pairs of target patterns comprises a top pattern and a bottom pattern;
   a first conductive line disposed on a first side of the plurality of pairs of target patterns, wherein the first conductive line is electrically connected to a top pattern of a $(aN+1)^{th}$ pair of target patterns in the plurality of pairs of target patterns and is not electrically connected to pairs of target patterns other than the $(aN+1)^{th}$ pair of target patterns in the plurality of pairs of target patterns, a is a fixed integer greater than or equal to 2, and N is an integer greater than or equal to 0; and
   a second conductive line disposed on a second side of the plurality of pairs of target patterns opposite to the first side, wherein the second conductive line is electrically connected to a bottom pattern of the $(aN+1)^{th}$ pair of target patterns in the plurality of pairs of target patterns and is not electrically connected to the pairs of target patterns other than the $(aN+1)^{th}$ pair of target patterns in the plurality of pairs of target patterns.

2. The semiconductor structure according to claim 1, wherein the first conductive line comprises:
   a first main body; and
   a plurality of first extensions extending respectively from a side wall of the first main body and covering a corresponding top pattern, wherein the first extensions are respectively electrically connected to the corresponding top pattern through a plurality of first contacts.

3. The semiconductor structure according to claim 1, wherein the second conductive line comprises:
   a second main body; and
   a plurality of second extensions extending respectively from a side wall of the second main body and covering a corresponding bottom pattern, wherein the second extensions are respectively electrically connected to the corresponding bottom pattern through a plurality of second contacts.

4. The semiconductor structure according to claim 1, wherein the first conductive line is configured to provide a first voltage to the top pattern of the $(aN+1)^{th}$ pair of target patterns in the plurality of pairs of target patterns, and the second conductive line is configured to provide a second voltage different from the first voltage to the bottom pattern of the $(aN+1)^{th}$ pair of target patterns in the plurality of pairs of target patterns to measure a core capacitance value of the $(aN+1)^{th}$ pair of target patterns.

5. The semiconductor structure according to claim 1, wherein
   when a is 2, the first conductive line is electrically connected to the top pattern of the first pair of target patterns, a top pattern of a third pair of target patterns, and a top pattern of a fifth pair of target patterns to a top pattern of a $(2N+1)^{th}$ pair of target patterns in the plurality of pairs of target patterns, and the second conductive line is electrically connected to the bottom pattern of the first pair of target patterns, a bottom pattern of the third pair of target patterns, and a bottom pattern of the fifth pair of target patterns to a bottom pattern of the $(2N+1)^{th}$ pair of target patterns in the plurality of pairs of target patterns.

6. The semiconductor structure according to claim 1, wherein the semiconductor structure is disposed in a test key on a scribe line between a plurality of dies.

7. A semiconductor structure comprising:
   a plurality of pairs of target patterns, wherein each of the plurality of pairs of target patterns comprises a top pattern and a bottom pattern;
   a first conductive line disposed on a first side of the plurality of pairs of target patterns, wherein the first conductive line is electrically connected to a top pattern of a $(aN+2)^{th}$ pair of target patterns in the plurality of pairs of target patterns and is not electrically connected to pairs of target patterns other than the $(aN+2)^{th}$ pair of target patterns in the plurality of pairs of target patterns, a is a fixed integer greater than or equal to 2, and N is an integer greater than or equal to 0; and
   a second conductive line disposed on a second side of the plurality of pairs of target patterns opposite to the first side, wherein the second conductive line is electrically connected to a bottom pattern of a $(aN+1)^{th}$ pair of target patterns in the plurality of pairs of target patterns and is not electrically connected to pairs of target patterns other than the $(aN+1)^{th}$ pair of target patterns in the plurality of pairs of target patterns.

8. The semiconductor structure according to claim 7, wherein the first conductive line comprises:
   a first main body; and
   a plurality of first extensions extending respectively from a side wall of the first main body and covering a corresponding top pattern, wherein the first extensions are respectively electrically connected to the corresponding top pattern through a plurality of first contacts.

9. The semiconductor structure according to claim 7, wherein the second conductive line comprises:
   a second main body; and
   a plurality of second extensions extending respectively from a side wall of the second main body and covering a corresponding bottom pattern, wherein the second extensions are respectively electrically connected to the corresponding bottom pattern through a plurality of second contacts.

10. The semiconductor structure according to claim 7, wherein the first conductive line is configured to provide a first voltage to the top pattern of the $(aN+2)^{th}$ pair of target patterns in the plurality of pairs of target patterns, and the second conductive line is configured to provide a second voltage different from the first voltage to the bottom pattern of the (aN+1)$^{th}$ pair of target patterns in the plurality of pairs of target patterns to measure a gap capacitance value between the (aN+2)$^{th}$ pair of target patterns and the (aN+2)$^{th}$ pair of target patterns.

11. The semiconductor structure according to claim 7, wherein when a is 2, the first conductive line is electrically connected to the top pattern of the second pair of target patterns, a top pattern of a fourth pair of target patterns, and a top pattern of a sixth pair of target patterns to the top pattern of the (aN+2)$^{th}$ pair of target patterns in the plurality of pairs of target patterns, and the second conductive line is electrically connected to the bottom pattern of the first pair of target patterns, a bottom pattern of a third pair of target patterns, and a bottom pattern of a fifth pair of target patterns to the bottom pattern of the (aN+1)$^{th}$ pair of target patterns in the plurality of pairs of target patterns.

12. The semiconductor structure according to claim 7, wherein the semiconductor structure is disposed in a test key on a scribe line between a plurality of dies.

\* \* \* \* \*